United States Patent
Byun et al.

(10) Patent No.: US 8,822,349 B1
(45) Date of Patent: Sep. 2, 2014

(54) OXIDE FORMATION IN A PLASMA PROCESS

(75) Inventors: Jeong Soo Byun, Cupertino, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/401,712

(22) Filed: Feb. 21, 2012

Related U.S. Application Data

(63) Continuation of application No. 11/836,683, filed on Aug. 9, 2007, now Pat. No. 8,119,538.

(51) Int. Cl.
*H01L 21/31* (2006.01)

(52) U.S. Cl.
USPC ............ 438/770; 438/768; 438/772; 438/77; 438/787

(58) Field of Classification Search
USPC ............................ 438/770, 772, 768, 77, 787
See application file for complete search history.

(56) References Cited

U.S. PATENT DOCUMENTS

| | | | |
|---|---|---|---|
| 5,434,109 A | 7/1995 | Geissler et al. | |
| 6,271,112 B1 | 8/2001 | Wooten et al. | |
| 6,458,650 B1 | 10/2002 | Huang et al. | |
| 2002/0004277 A1 | 1/2002 | Ahn et al. | |
| 2002/0013114 A1* | 1/2002 | Ohtani et al. | 445/23 |
| 2003/0026158 A1* | 2/2003 | Knall et al. | 365/225.7 |
| 2005/0045942 A1* | 3/2005 | Jung | 257/316 |
| 2005/0260107 A1* | 11/2005 | Jackson et al. | 422/136 |
| 2007/0249127 A1 | 10/2007 | Mora et al. | |
| 2008/0014718 A1* | 1/2008 | Neyret et al. | 438/459 |
| 2008/0224205 A1* | 9/2008 | Joshi et al. | 257/329 |
| 2008/0251833 A1 | 10/2008 | Specht et al. | |
| 2008/0296655 A1* | 12/2008 | Lin et al. | 257/321 |

OTHER PUBLICATIONS

USPTO Final Rejection for U.S. Appl. No. 11/836,683 dated Feb. 4, 2010; 13 pages.
USPTO Non-Final Rejection for U.S. Appl. No. 11/836,683 dated Jul. 7, 2009; 15 pages.
USPTO Non-Final Rejection for U.S. Appl. No. 11/836,683 dated Aug. 8, 2011; 17 pages.
USPTO Notice of Allowance for U.S. Appl. No. 11/836,683 dated Dec. 23, 2011; 9 pages.

* cited by examiner

*Primary Examiner* — Jae Lee

(57) ABSTRACT

A method of making a semiconductor structure is provided. The method includes forming a dielectric layer using a high density plasma oxidation process. The dielectric layer is on a storage layer and the thickness of the storage layer is reduced during the high density plasma oxidation process.

18 Claims, 5 Drawing Sheets

US 8,822,349 B1

OXIDE FORMATION IN A PLASMA PROCESS

RELATED APPLICATIONS

This application is a continuation application of U.S. application Ser. No. 11/836,683 filed Aug. 9, 2007, now U.S. Pat. No. 8,119,538 issued Feb. 21, 2012, which is incorporated herein by reference.

BACKGROUND

The present invention relates to oxide formation of a dielectric layer in a plasma process, and more specifically, oxide formation using a high density plasma oxidation process.

A variety of methods and structures have been used to form a dielectric layer using oxidation. Some conventional technologies include oxide deposition using a chemical vapor deposition process followed by the addition of heat for densification, an in-situ steam oxidation (ISSG) process, a rapid thermal oxidation process, and a high temperature oxidation (HTO) process. The problem with these conventional technologies is that since they are conducted at temperatures which may exceed 900° C., they require a high thermal budget. These temperatures may cause portions of the structure which is to be formed to become deformed and therefore reduce the accuracy of the structure. A need exists for a process which can form a layer having oxide at temperatures which do not exceed 900° C.

BRIEF SUMMARY

In a first aspect, the present invention is a method of making a semiconductor structure. The method includes forming a dielectric layer, on a storage layer, by HDP oxidation. The storage layer is on a tunneling layer. The tunneling layer is on a semiconductor substrate, and the thickness of the storage layer is reduced during the HDP oxidation.

In a second aspect, the present invention is a method of making a semiconductor structure. The method includes forming a dielectric layer on a semiconductor substrate using a high density plasma oxidation process. The dielectric layer is formed at a temperature of less than 700° C. The high density plasma oxidation process uses an ambient prepared from a mixture comprising hydrogen and oxygen.

BRIEF DESCRIPTION OF THE DRAWINGS

The invention can be better understood with reference to the following drawings and description.

Figure 1:
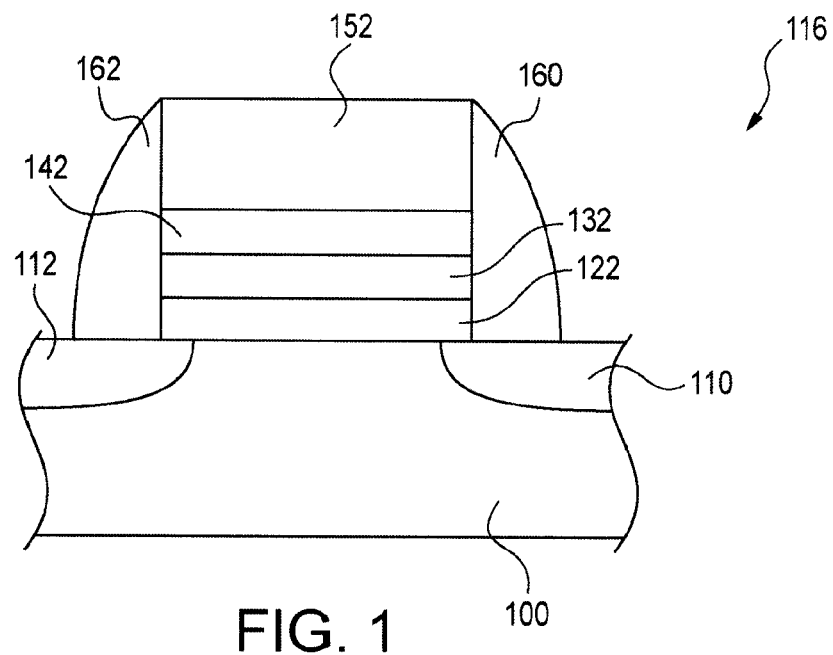
FIG. 1 depicts an edge-on view of a portion of a SONOS type semiconductor device having a blocking structure formed on a storage node.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

The present invention includes a dielectric layer which is formed using a high density plasma oxidation process. By using a high density plasma oxidation process, the dielectric layer can be formed at a much lower temperature than competing deposition processes, such as chemical vapor deposition (CVD), in-situ steam oxidation (ISSG), and rapid thermal oxidation. The lower temperature provides the benefit of a reduced thermal budget and prevents the distortion of certain components which are sensitive to high temperatures. Additionally, the high density plasma oxidation process results in a dielectric layer having a top surface which is much more uniform and smooth than that formed with competing deposition processes. Moreover, the thickness of a layer beneath the dielectric layer, such as a storage layer, can be reduced during the formation of the dielectric layer to a final thickness which is less than 20 Å. By reducing the thickness of the storage layer to less than 20 Å, semiconductor structures, such as memory cells, can be formed with greater accuracy at smaller sizes. In effect, the invention provides a semiconductor device which has a higher reliability and a reduced manufacturing cost due to the lower thermal budget.

Figure 2:
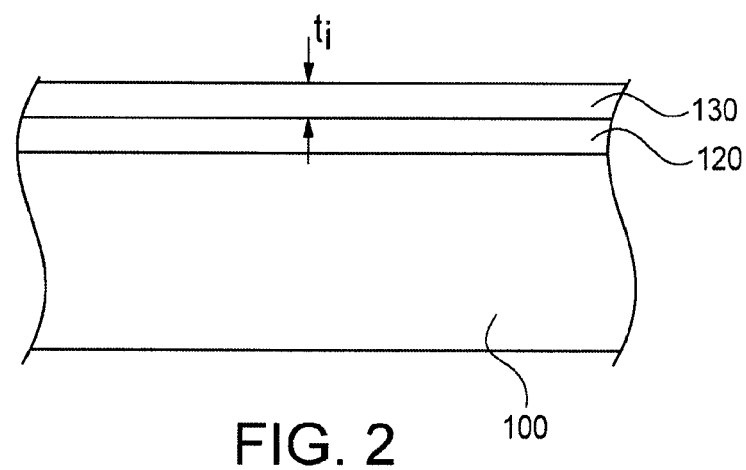
FIGS. 2-3 depict a series of successive edge-on views for forming a portion of the structure of FIG. 1.

Referring to FIG. 2, a storage layer 130 is formed on a first dielectric layer 120, which in turn is formed on a semiconductor substrate 100. Preferably, the semiconductor substrate 100 comprises a single crystal or polycrystalline silicon substrate, however, the semiconductor substrate 100 may comprise other materials. Suitable materials for semiconductor substrate 100 include silicon, gallium arsenide, germanium, gallium nitride, aluminum phosphide, Si1-xGex and AlxGa1-xAs alloys, wherein x is greater than or equal to zero and less than or equal to one, the like, and combinations thereof. Additional examples of materials for semiconductor substrate 100 in accordance with the present invention are set forth in Semiconductor Device Fundamentals by Robert F. Pierret (p. 4, Table 1.1, Addison-Wesley, 1996). The substrate 100 is loaded into a HDP system to form a dielectric layer 140 on the storage layer 130 in an oxygen and/or hydrogen ambient. As shown in FIG. 1, source and drain regions 110 and 112 may be formed in the semiconductor substrate 100 by methods well known to those of ordinary skill in the art. The storage layer 130 may comprise SiN, as in a SONOS type device. In one embodiment, the storage layer 130 is a floating gate.

The dielectric layer 120 may comprise silicon nitride, silicon oxynitride, or other oxides, nitrides, or oxynitrides. In one embodiment, the first dielectric layer 120 is formed using a high density plasma (HDP) oxidation process similar to one used to form a second dielectric layer 140, as discussed below. In one embodiment, the dielectric layer 120 forms a tunneling oxide layer comprising $SiO_2$, $SiO_2/Si_3N_4$, or $Si/SiO_2$.

Figure 3:
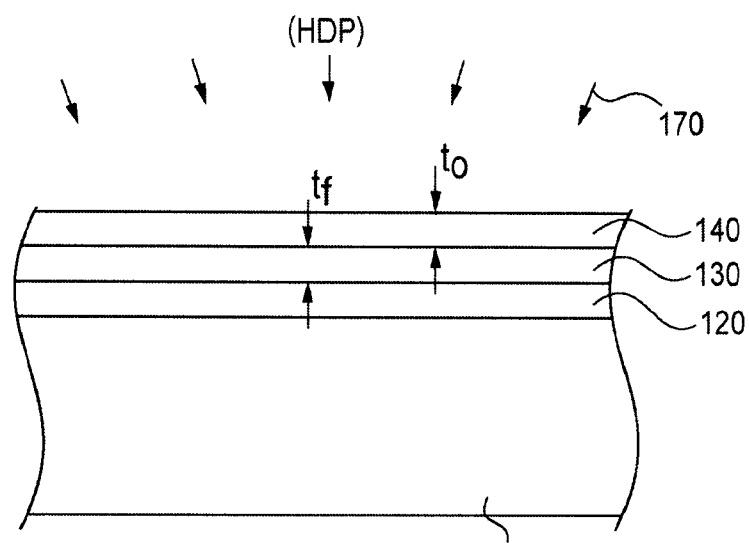
Figure 4:
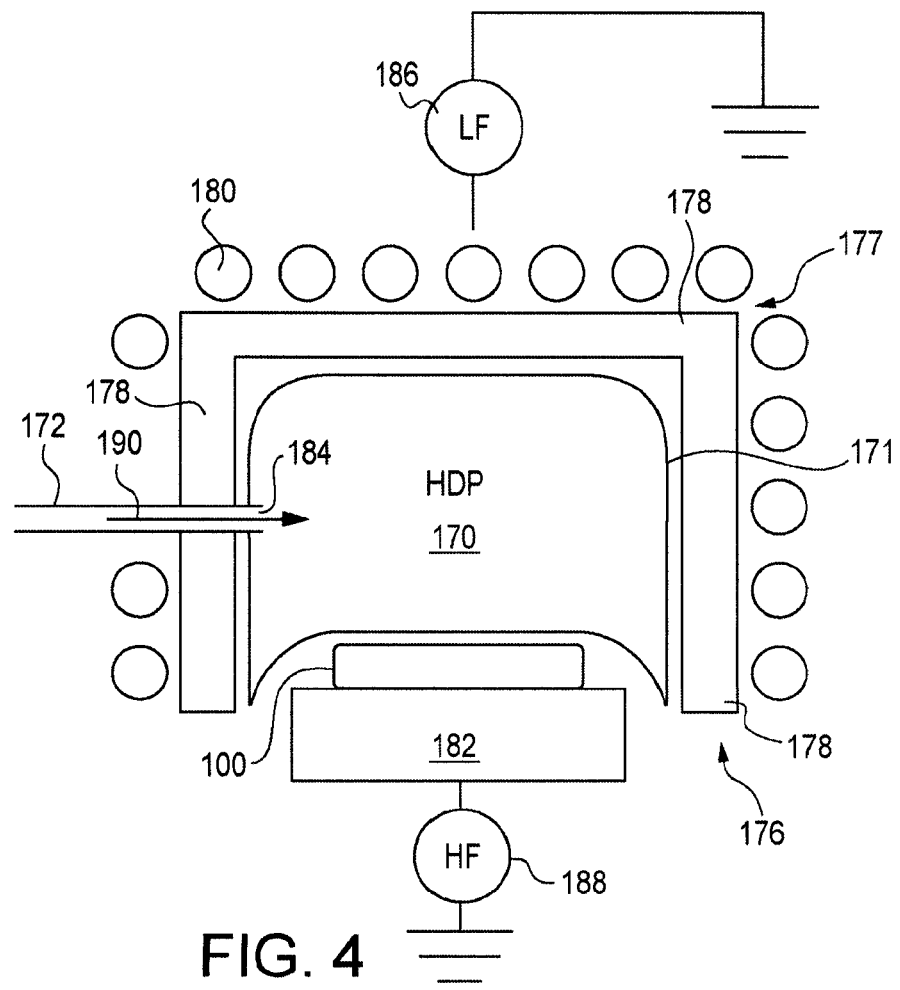
FIG. 4 depicts the structure shown in FIG. 3 being formed within a High Density Plasma (HDP) device.

Referring to FIGS. 3 and 4, a second dielectric layer 140 is formed on the storage layer 130 using a high density plasma (HDP) oxidation process. This same HDP oxidation process can also be used to form the first dielectric layer 120. Additionally, this same HDP oxidation process can also be used to form any dielectric layer described herein. Moreover, this same HDP oxidation process can be used to thin any silicon or nitride layer described herein by oxidizing a portion of the silicon or nitride layer described herein using HDP oxidation and removing said oxidized portion. The HDP oxidation process can also be used to form control oxide layers consisting of an oxide layer on a nitride layer on an oxide layer (an ONO structure).

Preferably, the second dielectric layer 140 comprises oxide, and more preferably, silicon oxide. The HDP oxidation process is conducted at a temperature preferably of less than 700° C., and more preferably less than 400° C. using high density plasma 170. But the temperature can be easily controlled up to 700° C. by adjusting a bias 188 to the substrate 100. The source of oxygen for the high density plasma 170 may be an oxygen containing precursor, or ambient 190, such as $O_2$, $O_2$, $N_2O$, NO, CO, $CO_2$, $H_2O$ or their mixture with any other inert gas (He, Ar, N, etc.), or an oxidizing gas (NO, $N_2O$, $O_2$, etc.). Preferably, the high density plasma 170 is also formed using a hydrogen containing precursor, or ambient 190, such as $H_2$, $NH_3$, $D_2$, $ND_3$. The high density plasma 170 may be generated by any one of a number of sources or HDP generating devices 176, such as HDP CVD tools manufactured by Novellus Systems Inc. of San Jose, Calif. or Applied Materials of Santa Clara, Calif. For example, one of the following sources may be used: helicon; helical-resonator; electron-cyclotron resonance; or inductively coupled plasma generator.

In one embodiment, the HDP generating device 176 is an HDP CVD tool in the SPEED line of tools manufactured by Novellus Systems Inc., of San Jose, Calif. Referring to FIG. 4, the HDP generating device 176 includes a housing 177 having walls 178 surrounding and defining a chamber 171. A coil 180 surrounds the housing 177 and is used to generate an electromagnetic field. Low frequency power is applied to the coil 180 at first through a bias 186. Secondary power may be applied to a wafer holder 182 through the bias 188 to control the temperature of the substrate 100.

The housing 177 forms an opening 184 through which a passageway 172 is formed. The opening 184 allows for an ambient 190 to be introduced into the chamber 171. The ambient 190 is later converted into high density plasma 170 in the chamber 171. The semiconductor substrate 100 rests on a wafer holder 182 within the chamber 171, on which high density plasma 170 is deposited using an HDP oxidation process. The substrate 100 can be unbiased, in which case ionized substances are accelerated by the plasma potential (on the order of 20 Volts) and then implanted into or onto the substrate 100. A bias can be applied to the substrate 100 to further accelerate the ions from the high density plasma and deposit them or implant them deeper into the surface of the substrate 100. Either a DC or RF bias may be applied to the substrate 100.

In one embodiment, the following process conditions are used by the HDP generating device 176 to create an HDP oxidation process used to form the second dielectric layer 140. The HDP generating device 176 is placed in an unbiased and unclamped (UBUC) mode. Preferably, a certain amount of low frequency power is applied to the first power node 186 and a certain amount of high frequency power is applied to the second power node 188. However, in certain applications, high frequency power is applied to the first power node 186 and low frequency power is applied to the second power node 188. The first power node 186 is connected with the coil 180 and the second power node 188 is connected with the wafer holder 182. Preferably, the low frequency power applied has a wattage from 1000 W to 30000 W, and more preferably from 2000 W to 25000 W, and more preferably about 3000 W.

Preferably, the low frequency power is applied having a frequency from 100 kHz to 1000 kHz, and more preferably a frequency from 200 kHz to 600 kHz, and even more preferably a frequency of 300 kHz to 500 kHz, and even more preferably about 450 kHz±10%, and most preferably greater than 400 kHz and less than 2000 kHz. High frequency power may also be applied to the coil 180. Preferably, no high frequency power is applied, and more preferably high frequency power is applied having a wattage from 0 W to 50 W, and a frequency of between 12 and 14 MHz, and most preferably about 13.56 MHz.

Ambient 190 is introduced into the chamber 171, preferably having a mixture of oxygen and hydrogen. Preferably, the oxygen is $O_2$ having a flow rate from 10 sccm to 1000 sccm, and more preferably from 90 sccm to 500 sccm, and most preferably from 100 sccm to 400 sccm. Preferably, the hydrogen is $H_2$ having a flow rate from 10 sccm to 1000 sccm, and more preferably from 90 sccm to 500 sccm, and most preferably from 100 sccm to 400 sccm. Preferably, the flow rate of the $O_2$ is within ±10% of the flow rate of the $H_2$, and more preferably the flow rate of the $O_2$ is within ±5% of the flow rate of the $H_2$, and most preferably the flow rate of the $O_2$ is about the same as the flow rate of the $H_2$. By having and the flow rate of the $O_2$ is within ±10% of the flow rate of the $H_2$, the thickness $t_0$ of the second dielectric layer 140 has good uniformity.

The temperature of the semiconductor substrate 100 on the wafer holder 182 is set in the UBUC mode to a temperature which is preferably less than 700° C., and more preferably less than 400° C., and even more preferably from 300° C. to 400° C., and even more preferably from 325° C. to 375° C., and most preferably about 350° C.±10%. The temperature of the semiconductor substrate 100 can later be controlled by application of bias power (i.e. ion bombardment). Upon setting the above process conditions in the HDP generating device 176, a high density plasma 170 is then created which begins an HDP oxidation process which is used to form the second dielectric layer 140. The amount of time required to run the HDP oxidation process can vary depending on the amount of dielectric material desired for making the second dielectric layer 140. In one embodiment, the HDP oxidation process is run from 10 to 120 seconds, and more preferably from 20 to 60 seconds, and more preferably about 30 seconds±10%.

In one embodiment, during the formation of a dielectric layer, such as the second dielectric layer 140, a portion of the layer on which the dielectric layer is formed on, such as a portion of the storage layer 130, is oxidized. Upon forming the dielectric layer using HDP oxidation, the dielectric layer, and the oxidized portion of the layer on which the dielectric layer is formed on, are both removed. For example, in one embodiment, the second dielectric layer 140 is formed on a storage layer 130 which comprises $Si_3N_4$ or $SiO_2$, and the thickness of the storage layer 130 is reduced through oxidization of a portion of the storage layer 130. The second dielectric layer 140 and the oxide formed on the storage layer 130 are then removed by applying an etch, such as a hydrofluoric acid (HF) solution, to the second dielectric layer 140, reducing the thickness of the storage layer 130. Preferably, the thickness of the storage layer 130 is measured upon removal of the oxidized portion, and a third dielectric layer (not shown) is formed on the storage layer 130 after the second dielectric layer 140 is removed. Through this process, the individual thickness of a dielectric layer formed, such as the second dielectric layer 140, and the individual thickness of the layer beneath the dielectric layer formed, such as the storage layer 130, can be controlled within ±1 nm.

In one embodiment the first dielectric layer 120 is formed on the semiconductor substrate 100 using the high density plasma (HDP) oxidation process discussed herein. The HDP oxidation process is conducted at a temperature preferably of less than 700° C. using high density plasma 170. The source of oxygen for the high density plasma 170 may be an oxygen containing precursor, or ambient 190, such as of $O_2$, $H_2$, or their mixture with any other inert gas (He, Ar, N, etc.), or an oxidizing gas (NO, $N_2O$, $O_2$, etc.). The high density plasma 170 may be generated by any one of a number of sources or HDP generating devices 176. For example, one of the following sources may be used: helicon; helical-resonator; electron-cyclotron resonance; or inductively coupled plasma generator. By using an HDP oxidation process, the first dielectric layer 120 can be formed with a lower thermal budget than by conventional means In one embodiment, upon forming the second dielectric layer 140, the semiconductor structure 116 shown in FIG. 1 is formed by patterning the first dielectric layer 120, the storage layer 130, and the second dielectric layer 140 to form a tunneling structure 122 from the first dielectric layer 120, a storage node 132 from the storage layer 130, and a blocking structure 142 from the second dielectric layer 140. A gate electrode 152 is formed on the blocking structure 142 and first and second sidewall spacers 160 and 162 are formed on each side of the stack of the tunneling structure 122, the storage node 132, the blocking structure 142, and the gate electrode 152, as shown in FIG. 1. Additionally, first and second doped regions 110 and 112 can be formed in the substrate 100. The semiconductor structure 116 can then be placed in a semiconductor device. The storage node 132 can be a floating gate, or can be part of a SONOS device.

Figure 5:
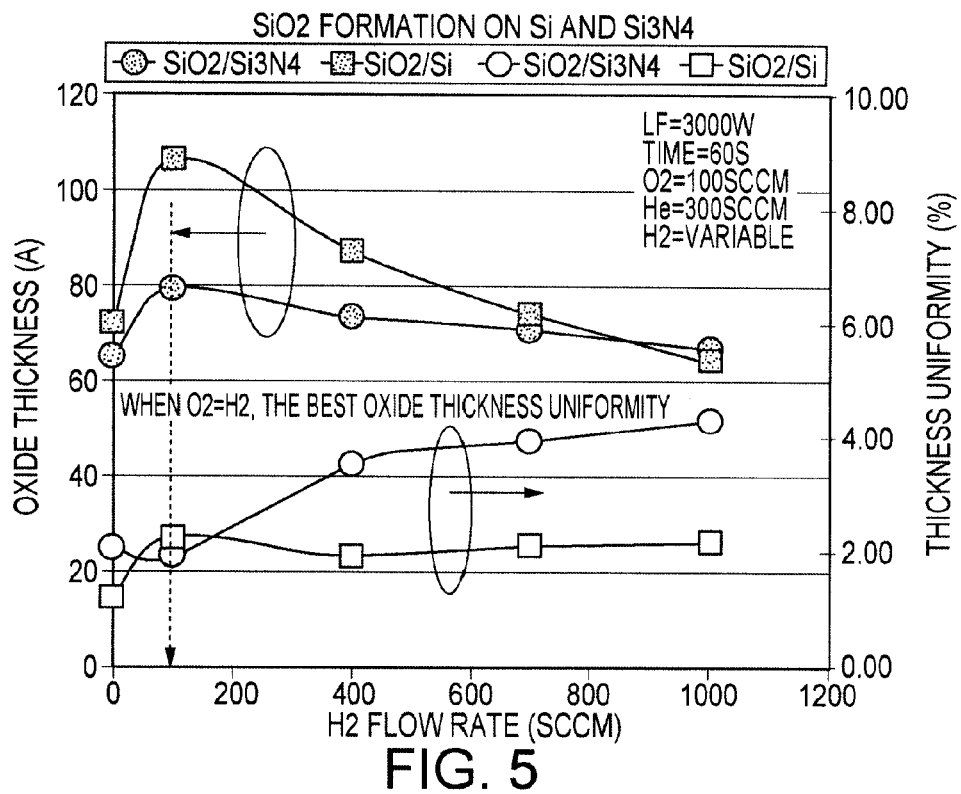
FIGS. 5 and 6 depict charts regarding $SiO_2$ formation on Si and on a $Si_3N_4$ substrate.
Figure 6:
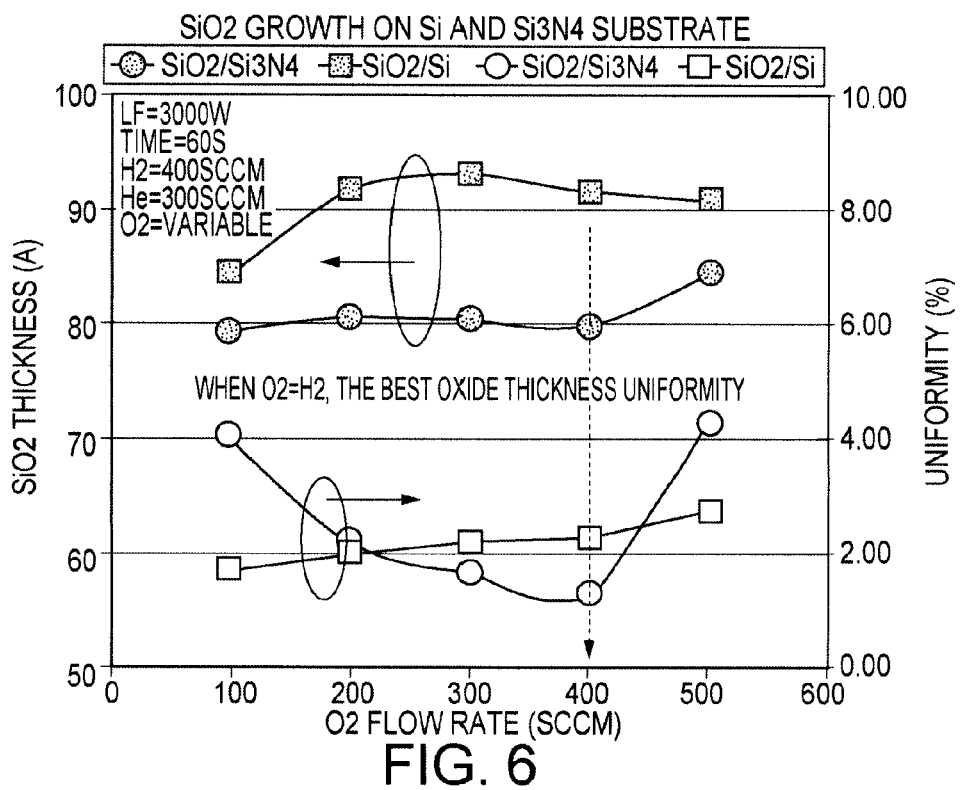

FIGS. 5 and 6 depict charts regarding $SiO_2$ formation on Si and on a $Si_3N_4$ substrate. In particular, FIG. 5 depicts a first set of profiles which chart the oxide thickness in angstroms of either $SiO_2$ formed on $Si_3N_4$ or $SiO_2$ formed on Si in relation to the flow rate of $H_2$ in sccm. FIG. 5 depicts a second set of profiles which chart the thickness uniformity in percent of either $SiO_2$ formed on $Si_3N_4$ or $SiO_2$ formed on Si in relation to the flow rate of $H_2$ in sccm. In FIG. 5, the HDP generating device 176 used the following process conditions: a low frequency wattage of 3000 W, a time of 60 seconds, a flow rate of 100 sccm for an $O_2$ ambient, and a flow rate of 300 sccm for an He ambient. As shown in FIG. 5, the best thickness uniformity for the dielectric layer which is formed during the process shown in FIG. 5 occurs when the flow rate of the $O_2$ ambient equals the flow rate of an $H_2$ ambient.

FIG. 6 depicts a second set of profiles which chart the thickness uniformity in percent of either $SiO_2$ formed on $Si_3N_4$ or $SiO_2$ formed on Si in relation to the flow rate of $O_2$ in sccm. In FIG. 6, the HDP generating device 176 used the following process conditions: a low frequency wattage of 3000 W, a time of 60 seconds, a flow rate of 400 sccm for an $H_2$ ambient, and a flow rate of 300 sccm for an He ambient. As shown in FIG. 6, the best thickness uniformity for the dielectric layer which is formed during the process shown in FIG. 6 occurs when the flow rate of the $O_2$ ambient equals the flow rate of an $H_2$ ambient.

Table A, shown below, indicates the Rms, the Ra, and the Rmax, all in angstroms, for the surface roughness of a dielectric layer formed using the above described HDP oxidation process, using an in-situ steam oxidation (ISSG) process, using an HTO process, and using an HTO+(GOX100) process. Table A illustrates how the Rms, the Ra, and the Rmax, are all lowest when using the above described HDP oxidation process. Preferably, the HDP oxidation process forms a second dielectric layer 140 with a surface roughness having a Rms of less than 2.70 Å, and more preferably of less than 2.50 Å, and most preferably of less than 2.20 Å. Preferably, the HDP oxidation process forms a second dielectric layer 140 with a surface roughness having a Ra of less than 2.15 Å, and more preferably of less than 2.0 Å, and most preferably of less than 1.75 Å. Preferably, the HDP oxidation process forms a second dielectric layer 140 with a surface roughness having a Rmax of less than 26 Å, and more preferably of less than 20 Å, and most preferably of less than 19 Å. As a result, use of the HDP oxidation process results in layers, such as the second dielectric layer 140, which have much more uniformity and therefore lower Rms, Ra, and Rmax values than comparable processes. Additionally, the storage layer 130, whose thickness is reduced when using the HDP oxidation process, can also be formed with much more uniformity and therefore lower Rms, Ra, and Rmax values than comparable processes. As a result, the final thickness $t_f$ of the storage layer 130 can also be greatly reduced with respect to competing deposition processes.

TABLE A

|  | HDP Oxidized ON | ON with HTO | ON with HTO + (GOX100) |
|---|---|---|---|
| Rms (A) | 2.15 (−26%) | 3.02 (+4%) | 2.91 (0%) |
| Ra (A) | 1.70 (−26%) | 2.39 (+4%) | 2.29 (0%) |
| Rmax (A) | 18.18 (−38%) | 26.86 (−9%) | 29.42 (0%) |

Figure 7:
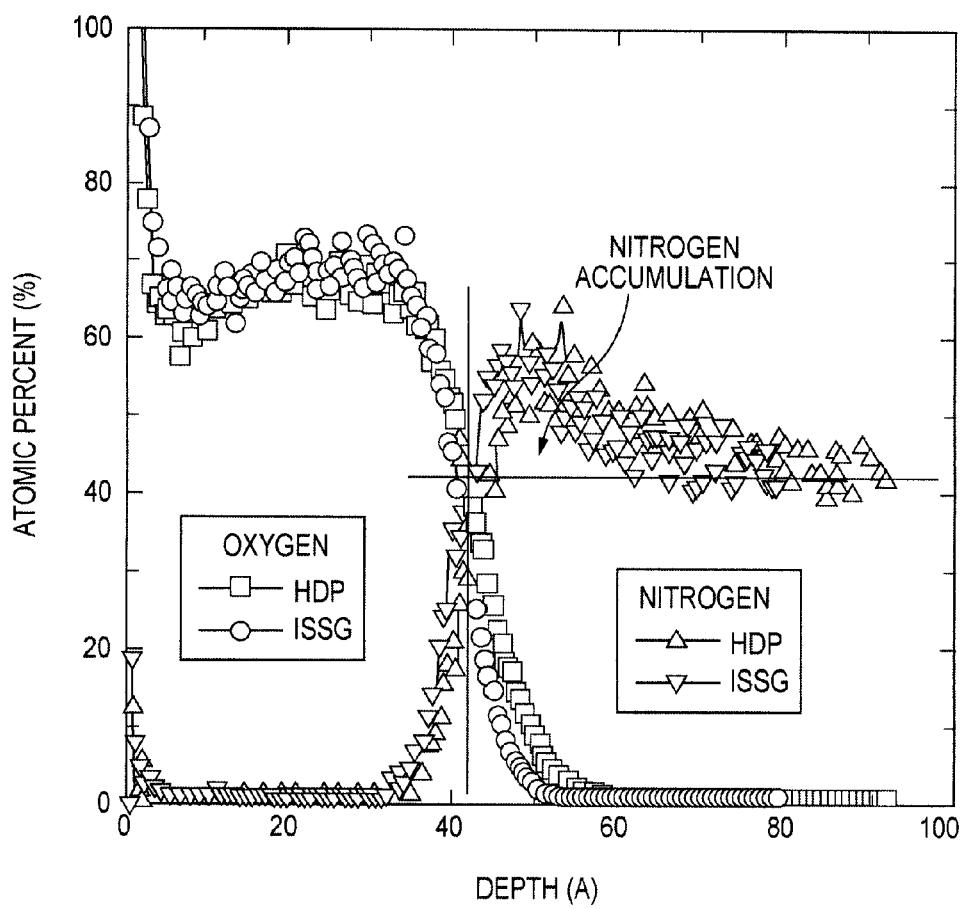
FIG. 7 depicts a chart which compares the differences between nitrogen and oxygen accumulation in atomic percentage at varying depths in a layer when using either a high density plasma oxidation process or an in-situ steam oxidation process.

FIG. 7 depicts a chart which compares the differences between nitrogen and oxygen accumulation in atomic percentage at varying depths in a layer, such as the storage layer 130, when using either a high density plasma oxidation process or an in-situ steam oxidation process. As observed in FIG. 7, when using the high density plasma oxidation process, at a depth exceeding 40 angstroms, there is more nitrogen and oxygen accumulation by atomic percentage than when using an in-situ steam oxidation process.

Figure 8:
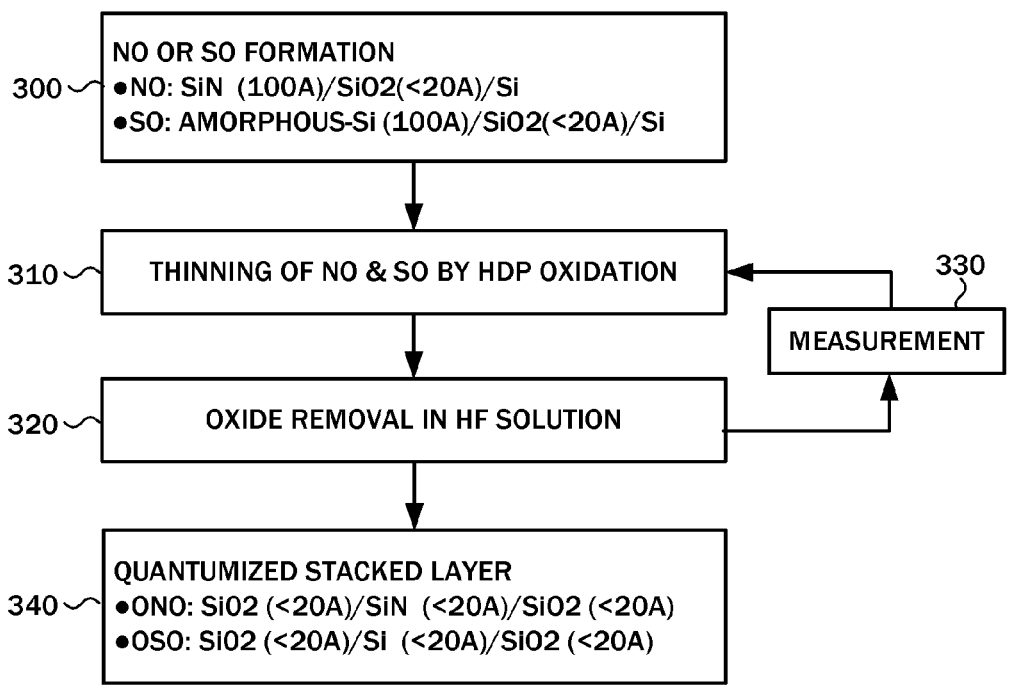
FIG. 8 depicts a flowchart illustration of thickness control of $Si_3N_4$ and Si by repetition of HDP oxidation and dipping in HF solution.

FIG. 8 depicts a flowchart illustration of oxide formation on a dielectric using a high density plasma oxidation process. At 300, a determination is made as to what type of structure is to be formed, either an ONO structure having a second dielectric layer 140 on a storage layer 130 comprising nitride on a first dielectric layer 120, or an OSO structure in which the storage layer 130 comprises silicon. Upon forming the storage layer 130, a second dielectric layer 140 is formed on the storage layer 130 using the above described HDP oxidation process.

In addition to forming the second dielectric layer 140, at 310 the HDP oxidation process also thins the storage layer 130. Upon thinning the storage layer 130, at 320 oxide from the second dielectric layer 140 is removed, preferably using a hydrofluoric acid solution. Upon removing oxide from the second dielectric layer 140, at 330 the thickness of the storage layer 130 is measured. If the thickness is sufficient, then the process moves to 340; if the thickness is insufficient, then the process moves back to 310. At 340, a final dielectric layer is formed on the storage layer 130 to form a quantumized stacked layer having either an ONO structure or an OSO structure. Preferably, each of the layers of either the ONO structure or the OSO structure is less than 50 angstroms thick, and more preferably less than 20 angstroms thick.

The individual processing steps for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; and Microchip Fabrication 4th edition, Peter Van Zant, McGraw-Hill, 2000.

Obviously, numerous modifications and variations of the present invention are possible in light of the above teachings. It is therefore to be understood that within the scope of the appended claims, the invention may be practiced otherwise than as specifically described herein.

The invention claimed is:

1. A method comprising:
    forming a dielectric layer on a storage layer by oxidation, wherein the storage layer is formed on a tunneling layer, and the thickness of the storage layer is reduced through oxidation of a portion of the storage layer during the formation of the dielectric layer;
    removing the dielectric layer; and
    measuring the thickness of the storage layer, and if the measured thickness exceeds a first thickness repeating the forming and removing of the dielectric layer to further reduce the thickness of the storage layer, and if the measured thickness is less than the first thickness forming a final dielectric layer on the storage layer,
    wherein the dielectric layer is formed by high density plasma (HDP) oxidation in an HDP device operated in an unbiased and unclamped (UBUC) mode.

2. The method of claim 1, wherein the storage layer comprises silicon nitride or silicon, and the tunneling layer comprises oxide.

3. The method of claim 2, wherein the dielectric layer is formed from plasma prepared from a mixture comprising hydrogen and oxygen.

4. The method of claim 2, wherein the dielectric layer is formed at a temperature of less than 700° C.

5. The method of claim 2, wherein the dielectric layer is formed from plasma prepared from a mixture comprising at least one of $O_2$, $N_2O$, $NO$, $CO$, $CO_2$, $H_2O$, $H_2$, $NH_3$, $D_2$, $ND_3$.

6. The method of claim 1, wherein the storage layer formed a floating gate.

7. A method of making a semiconductor device, comprising:
    making a semiconductor structure by the method of claim 2; and
    forming a semiconductor device from said semiconductor structure.

8. A method of making an electronic device, comprising:
    making a semiconductor device by the method of claim 7; and
    forming an electronic device comprising the semiconductor device.

9. The method of claim 1, wherein the final dielectric layer is formed by high density plasma (HDP) oxidation.

10. A method comprising:
    forming a dielectric layer on a storage layer by high density plasma (HDP) oxidation, wherein the thickness of the storage layer is reduced through oxidation of a portion of the storage layer during the formation of the dielectric layer;
    removing the dielectric layer;
    measuring the thickness of the storage layer, and if the measured thickness exceeds a predetermined thickness repeating the forming and removing of the dielectric layer to further reduce the thickness of the storage layer; and
    if the measured thickness is less than the predetermined thickness forming a final dielectric layer on the storage layer by HDP oxidation,
    wherein the dielectric layer is formed by high density plasma (HDP) oxidation in an HDP device operated in an unbiased and unclamped (UBUC) mode.

11. The method of claim 10, wherein the dielectric layer is formed from plasma prepared from a mixture comprising hydrogen and oxygen.

12. The method of claim 11, wherein the dielectric layer is formed at a temperature of less than 700° C.

13. The method of claim 10, wherein the final dielectric layer is formed from plasma prepared from a mixture comprising Deuterium.

14. A method comprising:
    forming a tunneling layer on a semiconductor substrate;
    forming a charge storage layer on the tunneling layer;
    forming a dielectric layer on the storage layer by oxidation, wherein the thickness of the charge storage layer is reduced through oxidation of a portion of the charge storage layer during the formation of the dielectric layer;
    removing the dielectric layer;
    measuring the thickness of the storage layer, and if the measured thickness exceeds a predetermined thickness repeating the forming and removing of the dielectric layer to further reduce the thickness of the storage layer; and
    if the measured thickness is less than the predetermined thickness forming a final dielectric layer on the storage layer,
    wherein the dielectric layer is formed by high density plasma (HDP) oxidation in an HDP device operated in an unbiased and unclamped (UBUC) mode.

15. The method of claim 14, wherein the dielectric layer is formed from plasma prepared from a mixture comprising hydrogen and oxygen.

16. The method of claim 15, wherein the dielectric layer is formed at a temperature of less than 700° C.

17. The method of claim 14, wherein the final dielectric layer is formed from plasma prepared from a mixture comprising Deuterium.

18. The method of claim 14, wherein the tunneling layer, the dielectric layer and the final dielectric layer are formed by high density plasma (HDP) oxidation.

* * * * *